(12) United States Patent
Takagi

(10) Patent No.: US 8,912,647 B2
(45) Date of Patent: Dec. 16, 2014

(54) SEMICONDUCTOR DEVICE FOR SMOOTHING THE VOLTAGE OF THE END FACE OF A DRAIN OF A HIGH FREQUENCY SEMICONDUCTOR CHIP

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 831 days.

(21) Appl. No.: 13/164,217

(22) Filed: Jun. 20, 2011

(65) Prior Publication Data

US 2012/0138954 A1 Jun. 7, 2012

(30) Foreign Application Priority Data

Dec. 7, 2010 (JP) ................. 2010-272916

(51) Int. Cl.
*H01L 23/66* (2006.01)
*H01L 23/047* (2006.01)
(Continued)

(52) U.S. Cl.
CPC ............ *H01L 23/047* (2013.01); *H01L 23/642* (2013.01); *H01L 23/66* (2013.01); *H01L 23/10* (2013.01); *H01L 2223/6611* (2013.01); *H01L 2223/6655* (2013.01); *H01L 2223/6688* (2013.01); *H01L 29/41758* (2013.01); *H01L 29/42316* (2013.01); *H01L 24/48* (2013.01); *H01L 24/49* (2013.01); *H01L 29/7786* (2013.01); *H01L 29/812* (2013.01); *H01L 29/2003* (2013.01); *H01L 2224/48091* (2013.01); *H01L 2224/48227* (2013.01); *H01L 2224/4911* (2013.01); *H01L 2924/19107* (2013.01); *H01L 2223/6666* (2013.01); *H01L 2223/665* (2013.01); *H01L 2924/1306* (2013.01); *H01L 2924/13063* (2013.01); *H01L 2924/13051* (2013.01); *H01L 2924/13064* (2013.01); *H01L 2924/1461* (2013.01); *H01L 2924/16195* (2013.01); *H01L 2924/163* (2013.01); *H01L 2924/164* (2013.01); *H01L 2224/49175* (2013.01); *H01L 2924/00014* (2013.01); *H01L 2924/3011* (2013.01); *H01L 2224/49111* (2013.01); *H01L 2924/30107* (2013.01)
USPC ......................................................... 257/728

(58) Field of Classification Search
CPC ..... H01L 23/642; H01L 23/58; H01L 23/538; H01L 23/047; H01L 23/47; H01L 23/48
USPC .................. 257/690, 691, 724, 728
See application file for complete search history.

(56) References Cited

U.S. PATENT DOCUMENTS 4,698,661 A 10/1987 Bessonneau et al.
5,371,405 A * 12/1994 Kagawa .................. 257/664
(Continued)

FOREIGN PATENT DOCUMENTS

JP 2-69002 3/1990
JP 2000-183222 6/2000
(Continued)

OTHER PUBLICATIONS

Office Action issued Nov. 6, 2012 in Japanese Patent Application No. 2010-272916 with English language translation.

(Continued)

Primary Examiner — Nathan Ha
(74) Attorney, Agent, or Firm — Oblon, Spivak, McClelland, Maier & Neustadt, L.L.P.

(57) ABSTRACT

According to one embodiment, provided is a semiconductor device includes: a high frequency semiconductor chip; an input matching circuit disposed at the input side of the high frequency semiconductor chip; an output matching circuit disposed at the output side of the high frequency semiconductor chip; a high frequency input terminal connected to the input matching circuit; a high frequency output terminal connected to the output matching circuit, and a smoothing capacitor terminal connected to the high frequency semiconductor chip. The high frequency semiconductor chip, the input matching circuit and the output matching circuit are housed by one package.

9 Claims, 12 Drawing Sheets

(51) Int. Cl.
  *H01L 23/64* (2006.01)
  *H01L 23/10* (2006.01)
  *H01L 29/417* (2006.01)
  *H01L 29/423* (2006.01)
  *H01L 23/00* (2006.01)
  *H01L 29/778* (2006.01)
  *H01L 29/812* (2006.01)
  *H01L 29/20* (2006.01)

(56) References Cited

U.S. PATENT DOCUMENTS

| | | | |
|---|---|---|---|
| 5,422,615 A * | 6/1995 | Shibagaki et al. | 333/246 |
| 5,576,661 A * | 11/1996 | Kumagai | 330/277 |
| 5,999,058 A | 12/1999 | Saitou et al. | |
| 6,281,756 B1 * | 8/2001 | Goto et al. | 330/302 |
| 6,396,342 B1 | 5/2002 | Takenaka | |
| 6,556,416 B2 * | 4/2003 | Kunihiro | 361/277 |
| 7,119,613 B2 | 10/2006 | Bakker | |
| 7,411,288 B2 | 8/2008 | Takagi | |
| 7,486,157 B2 | 2/2009 | Takagi | |
| 7,576,423 B2 | 8/2009 | Takagi | |
| 7,659,613 B2 | 2/2010 | Takagi | |
| 2002/0033508 A1 * | 3/2002 | Morikawa et al. | 257/368 |
| 2003/0063427 A1 * | 4/2003 | Kunihiro | 361/277 |
| 2007/0194407 A1 * | 8/2007 | Nakayama et al. | 257/532 |
| 2008/0088376 A1 * | 4/2008 | Tateoka et al. | 330/277 |
| 2008/0130253 A1 * | 6/2008 | Yamashita | 361/760 |
| 2008/0284539 A1 * | 11/2008 | Tateoka et al. | 333/124 |
| 2010/0052722 A1 * | 3/2010 | Takemoto et al. | 324/763 |

FOREIGN PATENT DOCUMENTS

| | | |
|---|---|---|
| JP | 2001-111364 A | 4/2001 |
| JP | 2007-060616 A | 3/2007 |
| WO | WO 2009/128035 A1 | 10/2009 |

OTHER PUBLICATIONS

Extended European Search Report issued Feb. 4, 2013, in European Patent Application No. 11170565.3.

U.S. Appl. No. 12/976,207, filed Dec. 22, 2010, Kazutaka Takagi.

Steve C. Cripps, "RF Power Amplifiers for Wireless Communications", 11.3 Bias Supply Modulation Effects, Artech House, pp. 337-357, May 28, 2006.

"Recommendations for the Handling, Mounting and Biasing of High Power GaAs FETs", http://www.oldexcelics.com/MFET%20APP%20NOTE.pdf, 4 pages, Oct. 4, 2003.

* cited by examiner

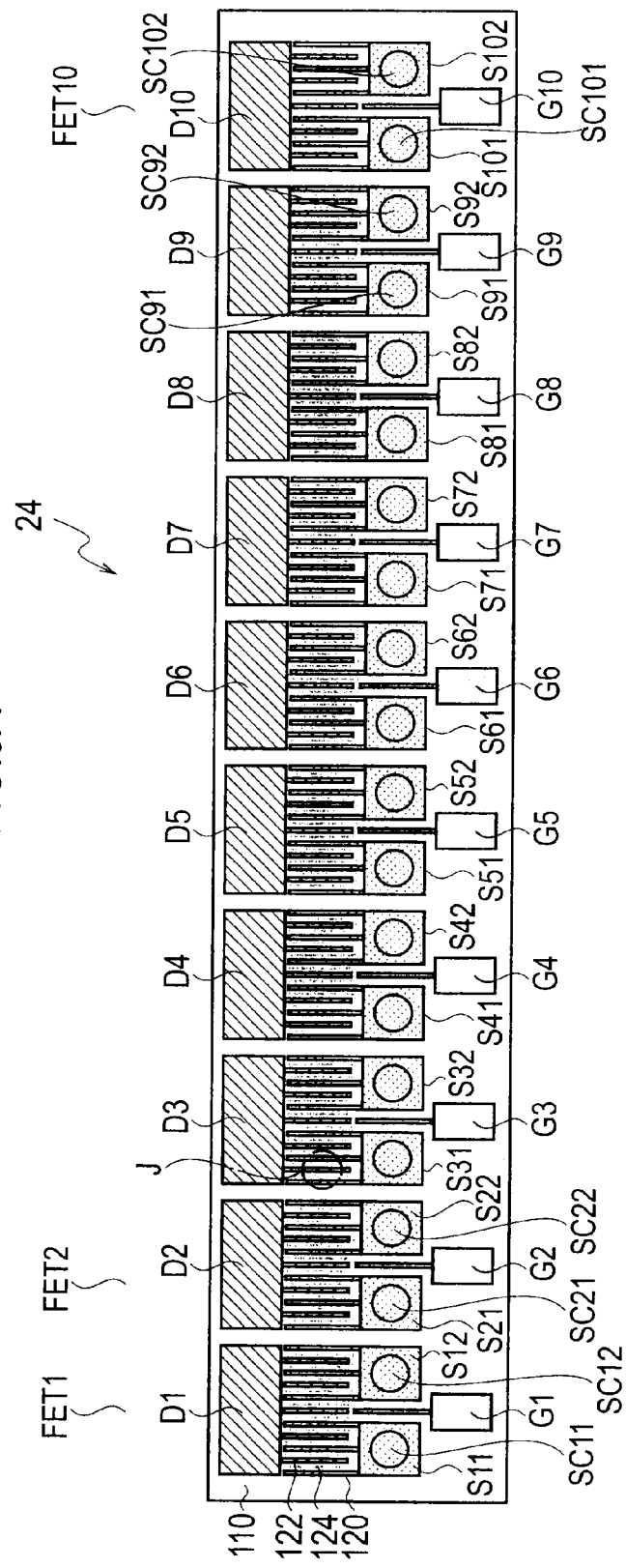
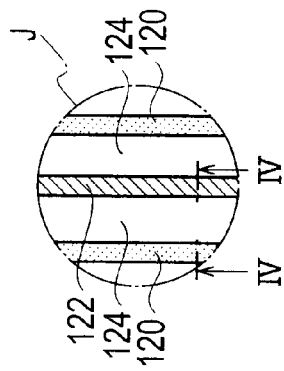
FIG.9A
FIG.9B

FIG. 14A
FIG. 14B
FIG. 14C
FIG. 14D
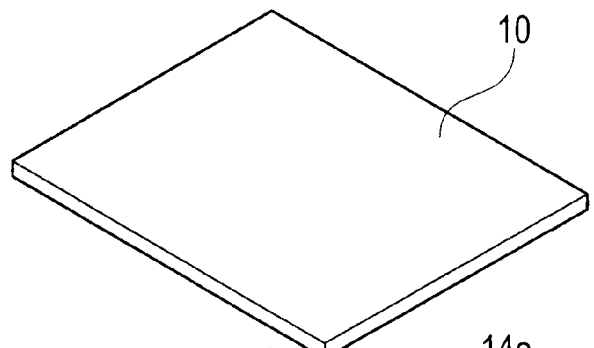
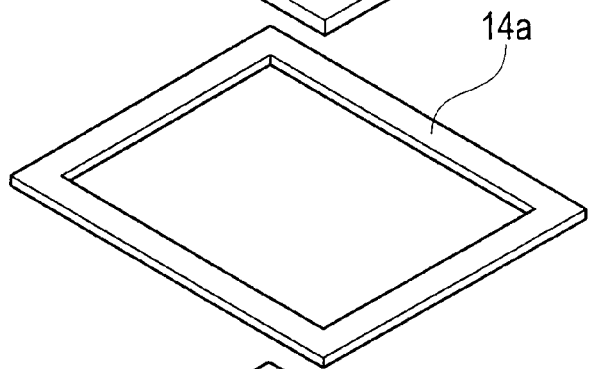
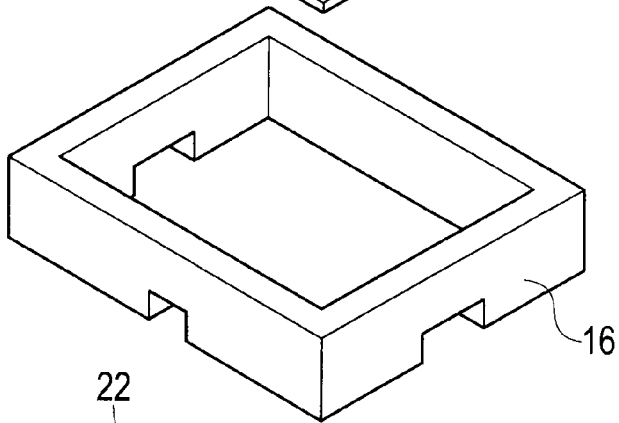
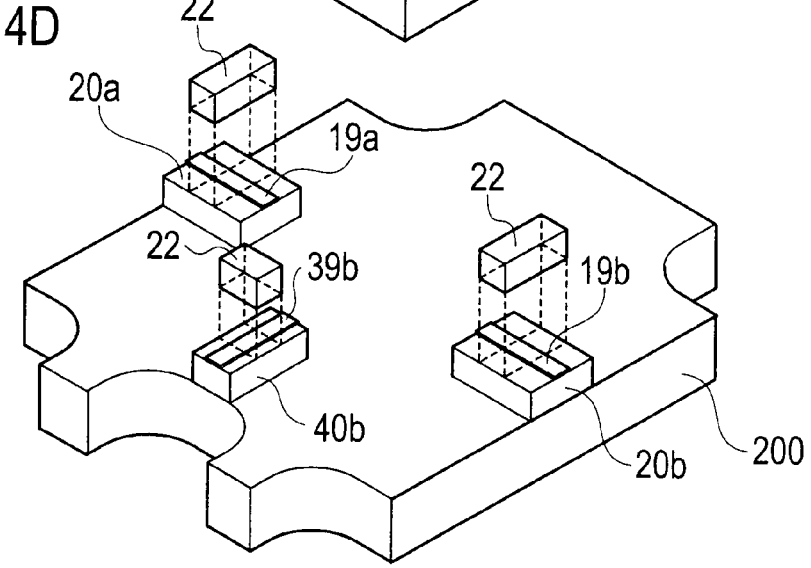

SEMICONDUCTOR DEVICE FOR SMOOTHING THE VOLTAGE OF THE END FACE OF A DRAIN OF A HIGH FREQUENCY SEMICONDUCTOR CHIP

CROSS REFERENCE TO RELATED APPLICATIONS

This application is based upon and claims the benefit of priority from prior Japanese Patent Application No. P2010-272916 filed on Dec. 7, 2010, the entire contents of which are incorporated herein by reference.

FIELD

Embodiments described herein generally relate to a semiconductor device.

BACKGROUND

Conventionally, a resin-sealed type and a sealed and airtight type are known as a package utilized for a semiconductor element.

The resin-sealed type semiconductor device has a structure which embedded directly the semiconductor element mounted in a leadframe in the resin by using a transfer mold etc., and is widely used by the advantage, such as low cost, being suitable for mass production, and a miniaturization being possible.

The sealed and airtight type semiconductor device has a structure which performed in hollow airtight maintenance of the semiconductor element mounted on a base substance composed of conductive materials, such as copper. Although the cost is higher compared with the resin-sealed type semiconductor device, the sealed and airtight type semiconductor device is used when high reliability is required because of excellent in airtightness.

In the sealed and airtight type package, it is known about an example of package mounting a semiconductor element directly on the heat radiation body composed of metal, and including input/output terminal units having convex feed through structure.

When two frequencies are inputted into one high frequency amplifier, the difference frequency component occurs. When the difference frequency is several MHz, the voltage of output terminal and the voltage of chip end face are smoothed by connecting a capacitor which is not less than 100 micro F near an RF output terminal.

However, when the difference frequency is several hundreds of MHz, the capacitor connected near the RF output terminal cannot smooth the voltage of the chip end face, since a matching circuit intervenes between the chip end face and the capacitor.

BRIEF DESCRIPTION OF THE DRAWINGS

FIG. 9A is an enlarged drawing of schematic planar pattern configuration of a high frequency semiconductor chip, in the semiconductor device according to the embodiment.

FIG. 9B is an enlarged drawing of a part J of FIG. 9A.

FIG. 14A shows a schematic bird's-eye view configuration of a package for mounting a semiconductor device according to a modified example of the embodiment, and is a schematic configuration diagram showing a metal cap.

FIG. 14B shows a schematic bird's-eye view configuration of the package for mounting the semiconductor device according to the modified example of the embodiment, and is a schematic configuration diagram showing a metal seal ring.

FIG. 14C shows a schematic bird's-eye view configuration of the package for mounting the semiconductor device according to the modified example of the embodiment, and is a schematic configuration diagram showing a metal wall.

FIG. 14D is a schematic bird's-eye view configuration of the package for mounting the semiconductor device according to the modified example of the embodiment, and is a schematic configuration diagram of a conductive base plate, an insulating layer, a feed through disposed on the insulating layer, and an upper layer feed through disposed on the insulating layer.

DETAILED DESCRIPTION

Figure 1A:
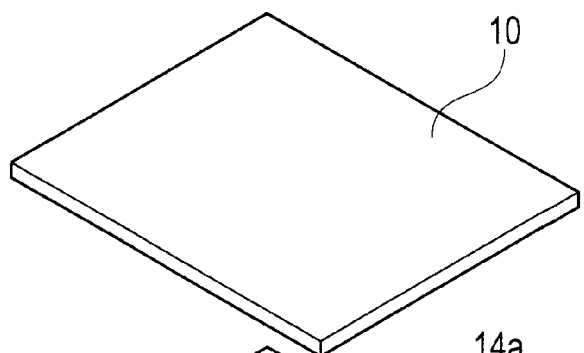
FIG. 1A shows a schematic bird's-eye view configuration of a package for mounting a semiconductor device according to an embodiment, and is a schematic configuration diagram of a metal cap.
Figure 1B:
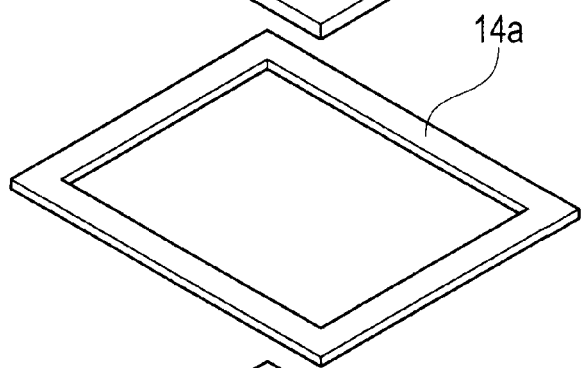
FIG. 1B shows a schematic bird's-eye view configuration of the package for mounting the semiconductor device according to the embodiment, and is a schematic configuration diagram of a metal seal ring.
Figure 1C:
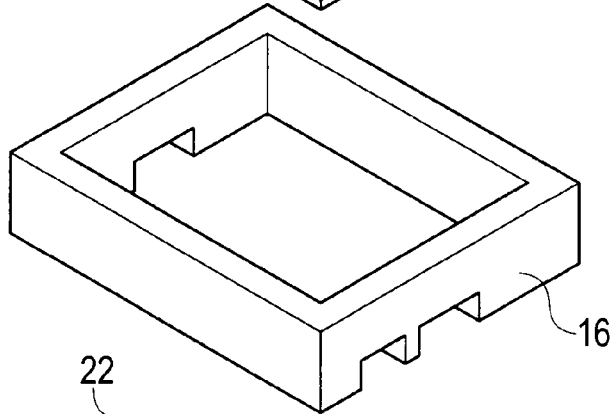
FIG. 1C shows a schematic bird's-eye view configuration of the package for mounting the semiconductor device according to the embodiment, and is a schematic configuration diagram of a metal wall.
Figure 1D:
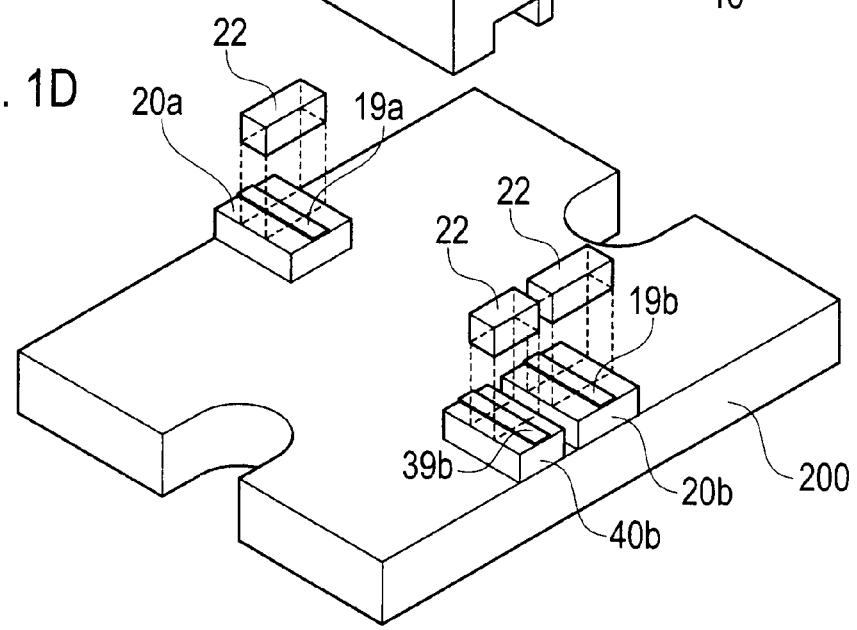
FIG. 1D shows a schematic bird's-eye view configuration of the package for mounting the semiconductor device according to the embodiment, and is a schematic configuration diagram of a conductive base plate, an insulating layer, a feed through disposed on the insulating layer, and an upper layer feed through disposed on the insulating layer.

Next, embodiments will be described with reference to drawings.

According to one embodiment, a semiconductor device includes a high frequency semiconductor chip, an input matching circuit, an output matching circuit, a high frequency input terminal, a high frequency output terminal, and a smoothing capacitor terminal. The input matching circuit is disposed at the input side of the high frequency semiconductor chip. The output matching circuit is disposed at the output side of the high frequency semiconductor chip. The high frequency input terminal is connected to the input matching circuit. The high frequency output terminal is connected to the output matching circuit. The smoothing capacitor terminal is connected to the high frequency semiconductor chip. The high frequency semiconductor chip, the input matching circuit, and the output matching circuit are housed by one package.

First Embodiment

Package Structure

FIG. 1 shows a schematic bird's-eye view configuration of a package for mounting a semiconductor device 1 according to an embodiment. A metal cap 10 is expressed as shown in FIG. 1A. A metal seal ring 14a is expressed as shown in FIG. 1B, a metal wall 16 is expressed as shown in FIG. 1C. A conductive base plate 200, and an input feed through 19a, an output feed through 19b and a feed through 39b utilized for capacitor disposed on an input side insulating layer 20a, an output side insulating layer 20b and an insulating layer 40b utilized for capacitor terminal are expressed as shown in FIG. 1D.

As shown in FIG. 1A to FIG. 1D, the package for mounting the semiconductor device 1 according to the embodiment includes: a metal cap 10; a metal seal ring 14a; a metallic wall 16; a conductive base plate 200; an input side insulating layer 20a, an output side insulating layer 20b and an insulating layer 40b utilized for capacitor terminal disposed on the conductive base plate 200; an input feed through 19a disposed on the input side insulating layer 20a; an output feed through 19b disposed on the output side insulating layer 20b; a feed through 39b utilized for capacitor disposed on the insulating layer 40b utilized for capacitor terminal; and upper layer feed throughs 22 disposed on the input side insulating layer 20a, the output side insulating layer 20b and the insulating layer 40b utilized for capacitor terminal.

—Conductive Base Plate 200—

The conductive base plate 200 is formed of conductive metals, such as copper and a copper molybdenum alloy, for example. Furthermore, electroplated conductors, such as Au, Ni, Ag, an Ag—Pt alloy and an Ag—Pd alloy, may be formed on the surface of the conductive base plate 200, for example.

Also, layered structure, such as Cu/Mo/Mo substrate, may be used for the conductive base plate 200.

—Metal Wall 16—

As a material of the metallic wall 16, it is formed of conductive metals, such as aluminum, molybdenum, and a copper molybdenum alloy, for example. A soldering metal layer (not shown) for soldering is formed on the top surface of the metallic wall 16 via the metal seal ring 14a. The solder metal layer can be formed of a gold germanium alloy, a gold tin alloy, etc., for example.

Moreover, the metallic wall 16 is disposed on the conductive base plate 200 via a conductive adhesive material. In addition, the metal wall 16 is disposed on the convex upper layer feed through 22, in the feed-through portion (refer to FIG. 1 and FIG. 3). Each of the convex upper layer feed throughs 22 is disposed on the input side insulating layer 20a and the output side insulating layer 20b and the insulating layer 40b utilized for capacitor terminal, respectively. In this case, the input side insulating layer 20a, the output side insulating layer 20b and the insulating layer 40b utilized for capacitor terminal are equivalent to a lower layer feed through.

—Metal Cap 10—

The metal cap 10 has a flat plate shape as shown in FIG. 1A.

The metal cap 10 is disposed on the metallic wall 16 via the metal seal ring 14a.

The package for mounting the semiconductor device 1 according to the embodiment has a high frequency characteristics of not less than 2 GHz. Accordingly, the package according to the first embodiment is applicable as a package for devices and component parts having high frequency (that is, frequency over 2 GHz).

(Semiconductor Device)

—Planar Pattern Configuration—

Figure 2:
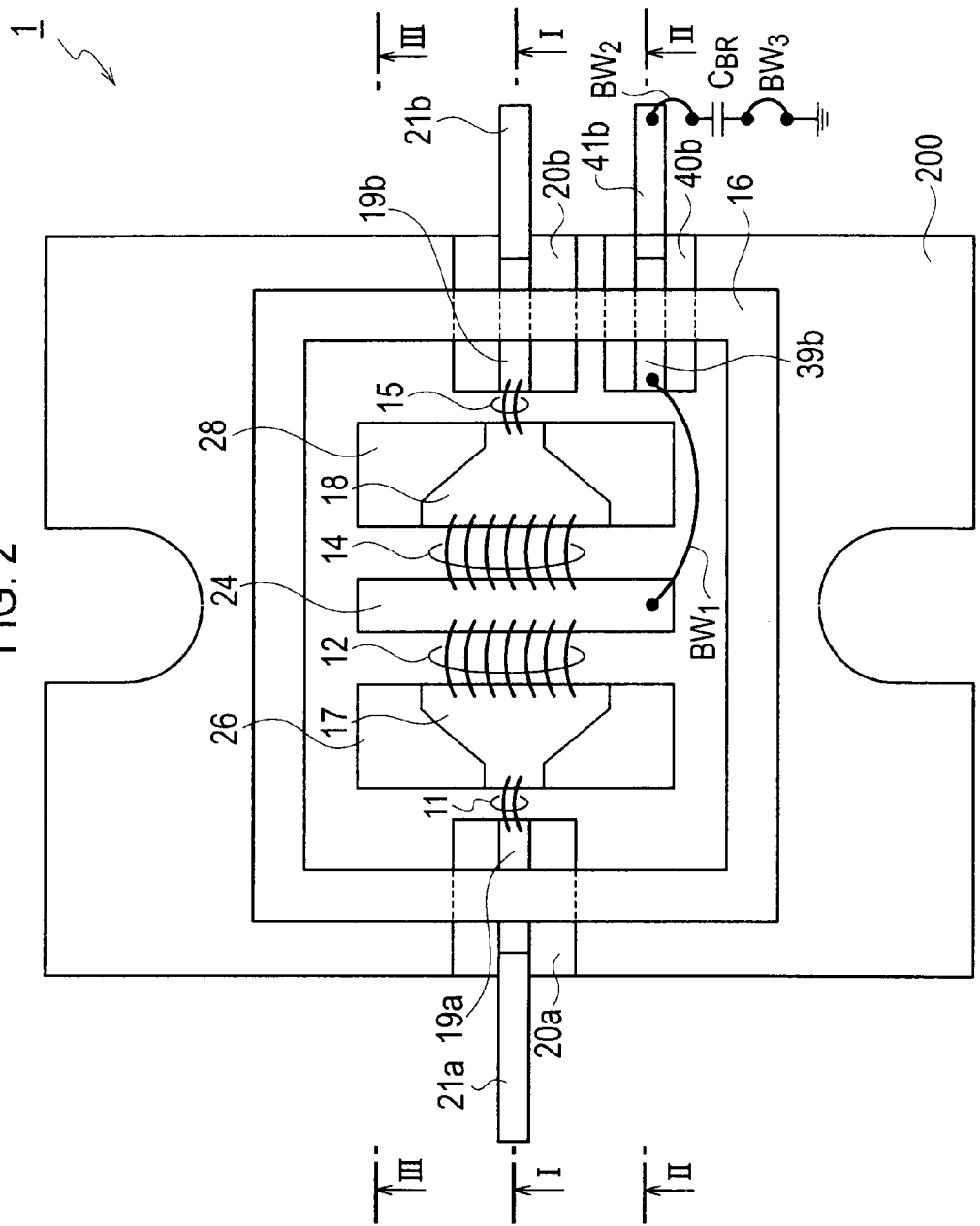
FIG. 2 is a schematic plane constitution diagram of the semiconductor device according to the embodiment.
Figure 3:
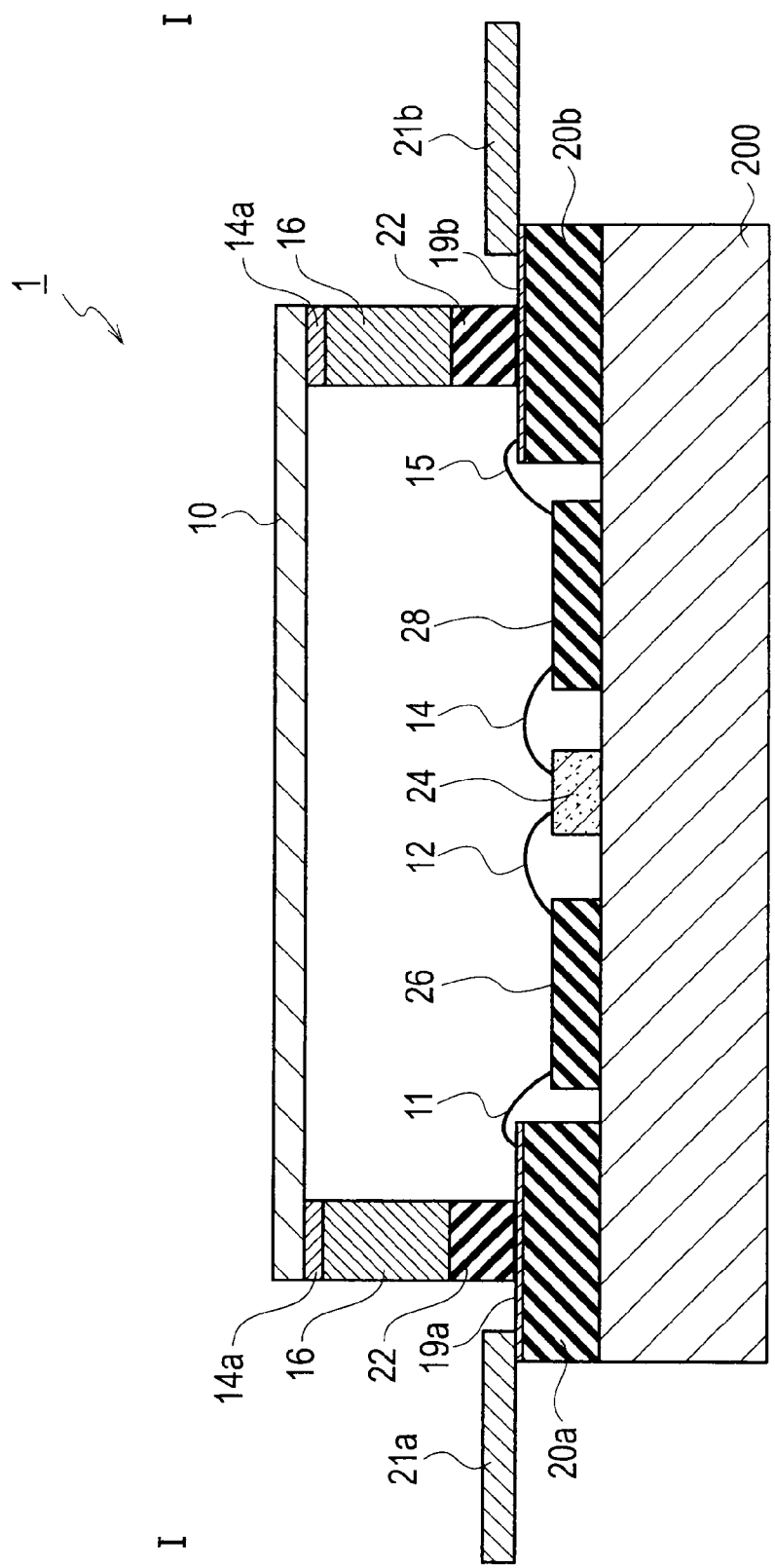
FIG. 3 is a schematic cross-sectional configuration of the semiconductor device according to the embodiment, and a schematic cross-sectional configuration diagram taken in the line I-I of FIG. 2.
Figure 4:
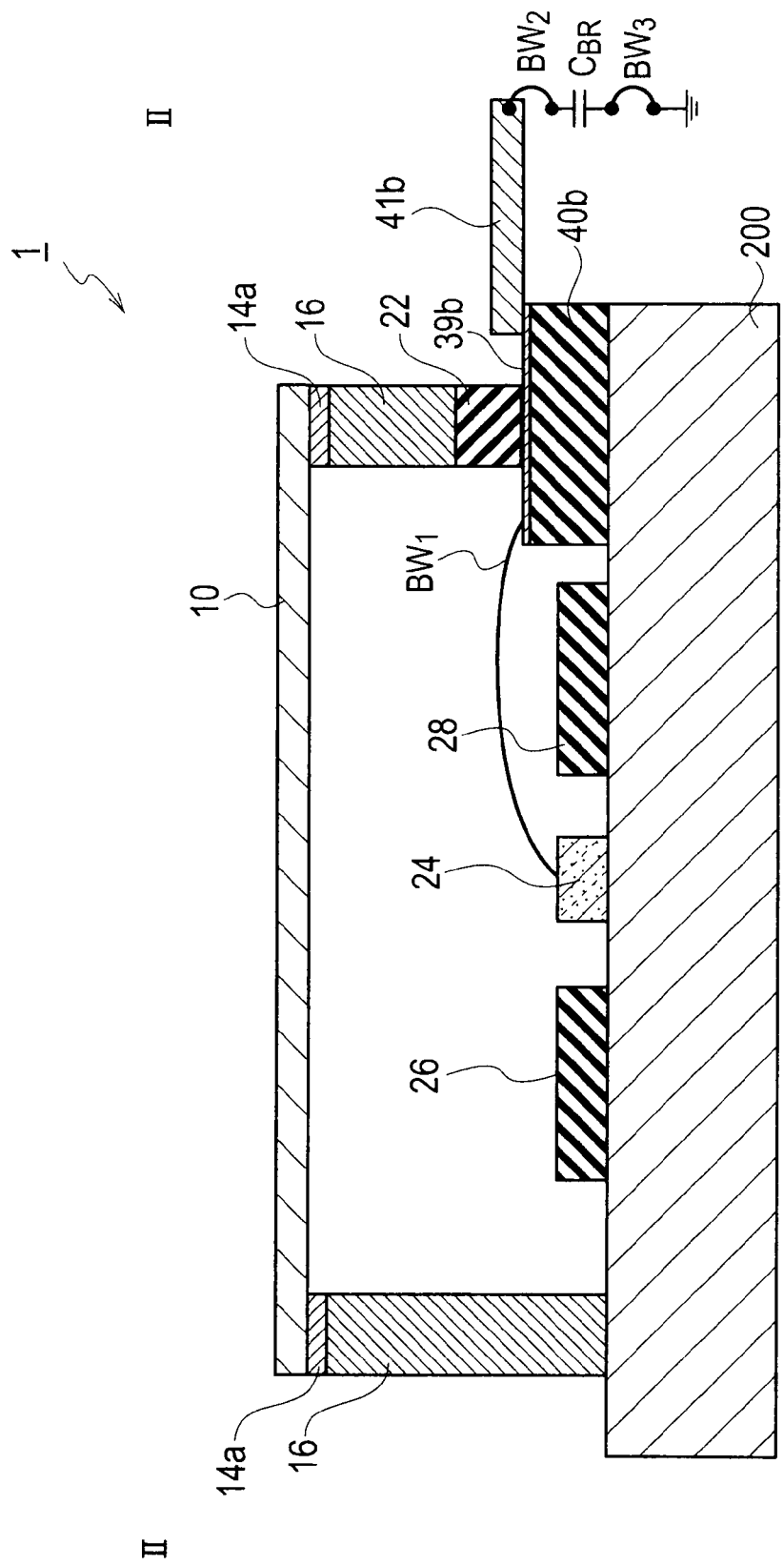
FIG. 4 is a schematic cross-sectional configuration of the semiconductor device according to the embodiment, and is a schematic cross-sectional configuration diagram taken in the line II-II of FIG. 2.
Figure 5:
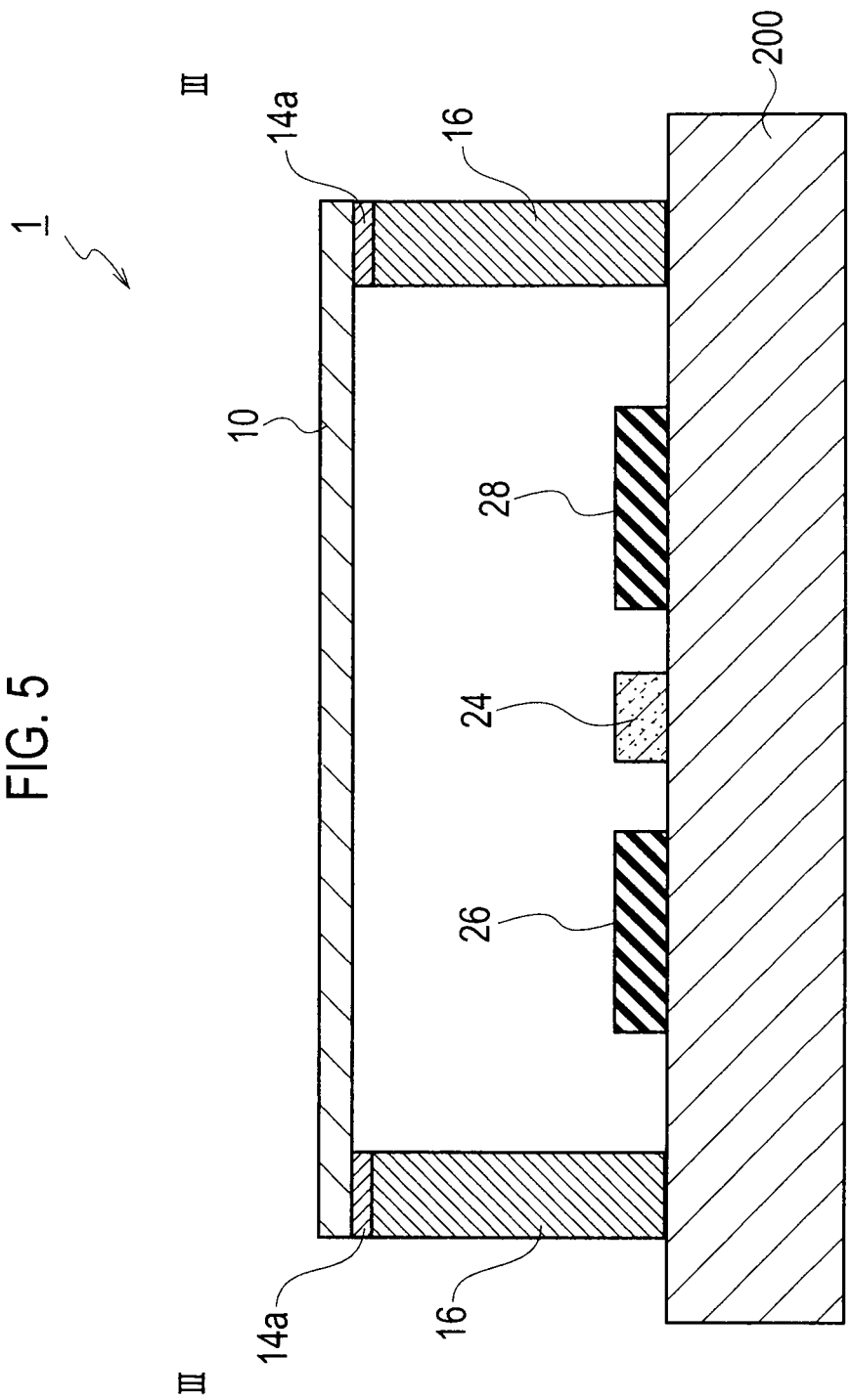
FIG. 5 is a schematic cross-sectional configuration of the semiconductor device according to the embodiment, and is a schematic cross-sectional configuration diagram taken in the line III-III of FIG. 2.

A schematic planar pattern configuration of the semiconductor device 1 according to the embodiment is expressed as shown in FIG. 2, a schematic cross-section structure taken in the line I-I of FIG. 2 is expressed as shown in FIG. 3, a schematic cross-section structure taken in the line II-II of FIG. 2 is expressed as shown in FIG. 4, and a schematic cross-section structure taken in the line of FIG. 2 is expressed as shown in FIG. 5.

As shown in FIG. 2 to FIG. 5, the semiconductor device 1 according to the embodiment includes: a high frequency semiconductor chip 24; an input matching circuit 17 disposed at the input side of the high frequency semiconductor chip 24; an output matching circuit 18 disposed at the output side of the high frequency semiconductor chip 24; a high frequency input terminal 21a connected to the input matching circuit 17; a high frequency output terminal 21b connected to the output matching circuit 18; and a smoothing capacitor terminal 41b connected to the high frequency semiconductor chip 24. In this case, the high frequency semiconductor chip 24, the input matching circuit 17 and the output matching circuit 18 are housed by one package.

As shown in FIG. 2 and FIG. 4, the semiconductor device 1 according to the embodiment includes a bypass reservoir capacitor (smoothing capacitor) $C_{BR}$ connected between the smoothing capacitor terminal 41b and the ground potential (earth potential). The smoothing capacitor $C_{BR}$ has a value more than $C_{BR} = I_{PK} \times (1/2\pi\Delta f)/\Delta V$ where $C_{BR}$ is a value of the smoothing capacitor $C_{BR}$, $I_{PK}$ is a value of current amplitude, $\Delta V$ is a value of an allowable ripple voltage, and $\Delta f$ is a value of difference frequency.

The semiconductor device 1 according to the embodiment includes the feed through 39b utilized for capacitor connected to the high frequency semiconductor chip 24, as shown in FIG. 2 and FIG. 3. In this case, the smoothing capacitor terminal 41b is connected to the drain terminal electrode D of the high frequency semiconductor chip 24 via the feed through 39b utilized for capacitor.

Also, as shown in FIG. 2 and FIG. 4, the semiconductor device 1 according to the embodiment includes a bonding wire BW1 for connecting smoothing capacitor which connects between a drain terminal electrode D of the high frequency semiconductor chip 24, and the feed through 39b utilized for capacitor.

Also, as shown in FIG. 2 and FIG. 3, the semiconductor device 1 according to the embodiment includes the input feed through 19a connected to the input matching circuit 17, and the high frequency input terminal 21a is connected to a gate terminal electrode G of the high frequency semiconductor chip 24 via the input feed through 19a.

Also, as shown in FIG. 2 and FIG. 3, the semiconductor device 1 according to the embodiment includes the output feed through 19b connected to the output matching circuit 18, and the high frequency output terminal 21b is connected to the drain terminal electrode D of the high frequency semiconductor chip 24 via the output feed through 19b.

Also, as shown in FIG. 2, the high frequency output terminal 21b and the smoothing capacitor terminal 41b may be disposed to adjoin each other.

Also, as shown in FIG. 2 to FIG. 5, the semiconductor device 1 according to the embodiment includes: the high frequency semiconductor chip 24 disposed on the conductive base plate 200; an input circuit substrate 26 disposed on the conductive base plate 200 at the input side of the high frequency semiconductor chip 24; and an output circuit substrate 28 disposed on the conductive base plate 200 at the output side of the high frequency semiconductor chip 24.

The input matching circuit 17 is disposed on the input circuit substrate 26. Moreover, the output matching circuit 18 is disposed on the output circuit substrate 28.

The input matching circuit 17 is connected to the gate terminal electrode G of the high frequency semiconductor chip 24 via the bonding wire 12, and the output matching circuit 18 is connected to the drain terminal electrode D of the high frequency semiconductor chip 24 via the bonding wire 14.

The high frequency input terminal 21a is connected to the input feed through 19a, and the high frequency output terminal 21b is connected to the output feed through 19b.

The high frequency input terminal 21a is connected to the gate terminal electrode G of the high frequency semiconductor chip 24 via the input feed through 19a, the bonding wire 11 and the input matching circuit 17.

—Circuit Configuration—

Figure 6:
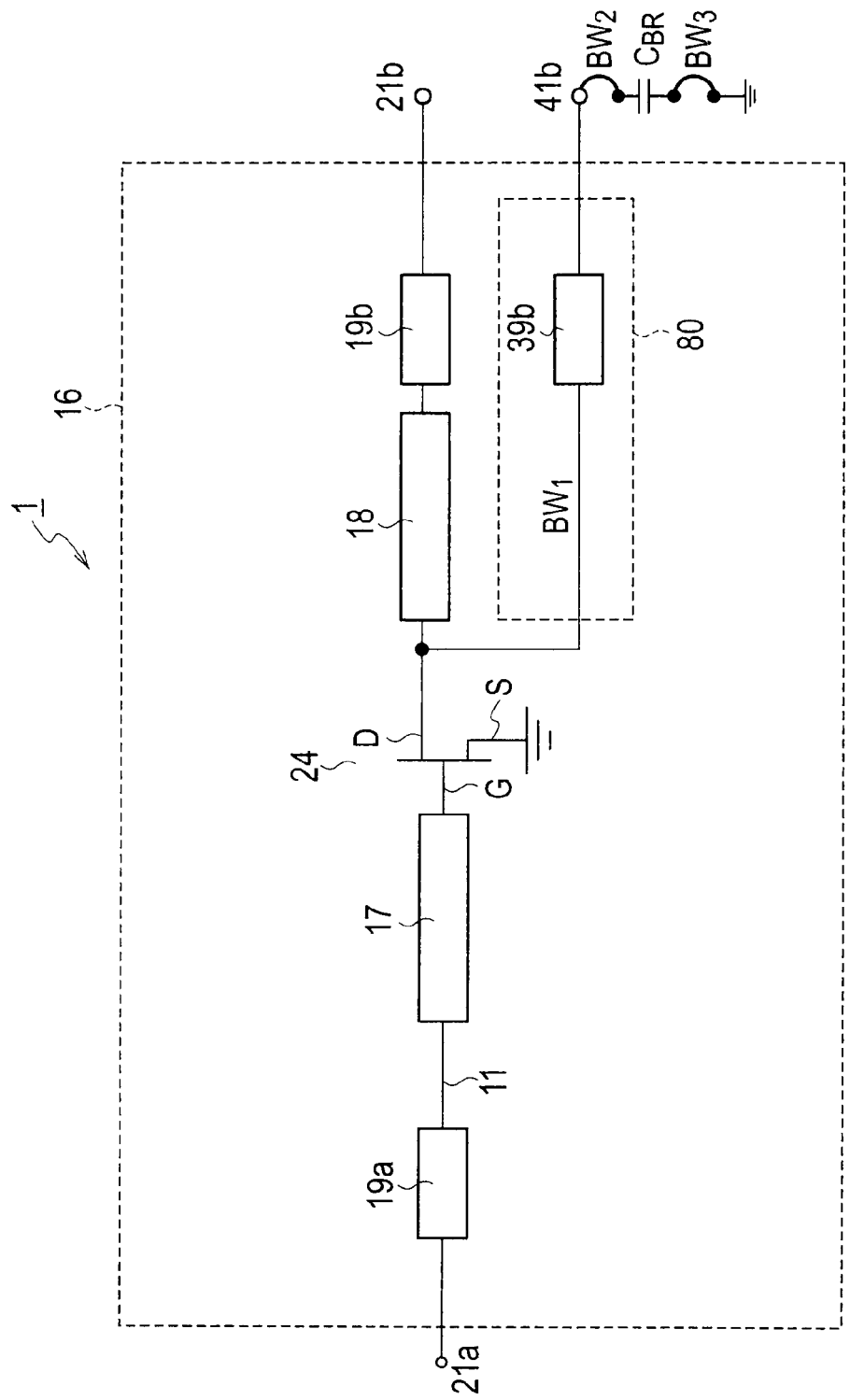
FIG. 6 is a schematic circuit configuration diagram of the semiconductor device according to the embodiment.

As shown in FIG. 6, a schematic circuit configuration of the semiconductor device 1 according to the embodiment includes: the high frequency semiconductor chip 24; the input matching circuit 17 disposed at the input side of the high frequency semiconductor chip 24; the output matching circuit 18 disposed at the output side of the high frequency semiconductor chip 24; the input feed through 19a connected to the input matching circuit 17; the high frequency input terminal 21a connected to the input feed through 19a; the output feed through 19b connected to the output matching circuit 18; the high frequency output terminal 21b connected to the output feed through 19b; a capacitor connection circuit 80 disposed at the output side of the high frequency semiconductor chip 24; and the smoothing capacitor terminal 41b connected to the capacitor connection circuit 80. In this case, the high frequency semiconductor chip 24, the input matching circuit 17 and the output matching circuit 18 are housed by one package surrounded by the metal wall 16.

The capacitor connection circuit 80 includes a bonding wire BW1 for connecting smoothing capacitor which connects between the drain terminal electrode D of the high frequency semiconductor chip 24 and the feed through 39b utilized for capacitor.

Also, as shown in FIG. 6, the electrode of one side of the smoothing capacitor $C_{BR}$ is connected to the smoothing capacitor terminal 41b via a bonding wire for connecting smoothing capacitor BW2, and the electrode of another side of the smoothing capacitor $C_{BR}$ is connected to the ground potential via a bonding wire for connecting smoothing capacitor BW3.

As shown in FIG. 6, the semiconductor device 1 according to the embodiment includes the smoothing capacitor terminal 41b, and the smoothing capacitor terminal 41b is connected with the drain terminal electrode D of the high frequency semiconductor chip 24 via the feed through 39b utilized for capacitor and the bonding wire BW1 for connecting smoothing capacitor. In the above-mentioned connection, since it is connected without via the output matching circuit 18, even when the difference frequency Δf is several hundreds of MHz, the voltage of the drain terminal electrode D of the high frequency semiconductor chip 24 is smoothed.

Figure 7:
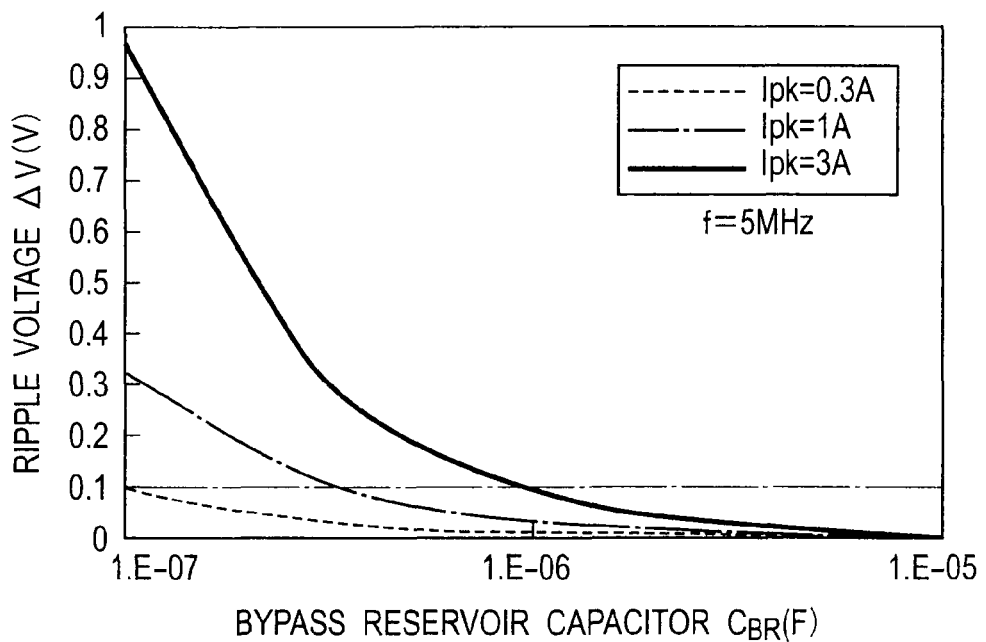
FIG. 7 shows a simulation result showing the relationship between a ripple voltage $\Delta V$ applying a current amplitude $I_{PK}$ as a parameter, and a bypass reservoir capacitor $C_{BR}$, in the semiconductor device according to the embodiment.

FIG. 7 shows a simulation result showing the relationship between the ripple voltage ΔV applying a current amplitude $I_{PK}$ as a parameter, and the bypass reservoir capacitor (smoothing capacitor) $C_{BR}$, in the semiconductor device 1 according to the embodiment. FIG. 7 shows an example that the difference frequency Δf is equal to 5 MHz.

As shown in FIG. 7, in order to reduce the ripple voltage ΔV to not more than 0.1 V, for example, when the difference frequency Δf is 50 MHz and the current amplitude $I_{PK}$ is 0.3 A, the value of not less than 0.1 μF is needed for the bypass reservoir capacitor $C_{BR}$. Similarly, when the difference frequency Δf is 50 MHz and the current amplitude $I_{PK}$ is 1.0 A, the value of not less than 0.3 μF is needed for the bypass reservoir capacitor $C_{BR}$. Similarly, when the difference frequency Δf is 50 MHz and the current amplitude $I_{PK}$ is 3.0 A, the value of not less than 1.0 μF is needed for the bypass reservoir capacitor $C_{BR}$.

Figure 8:
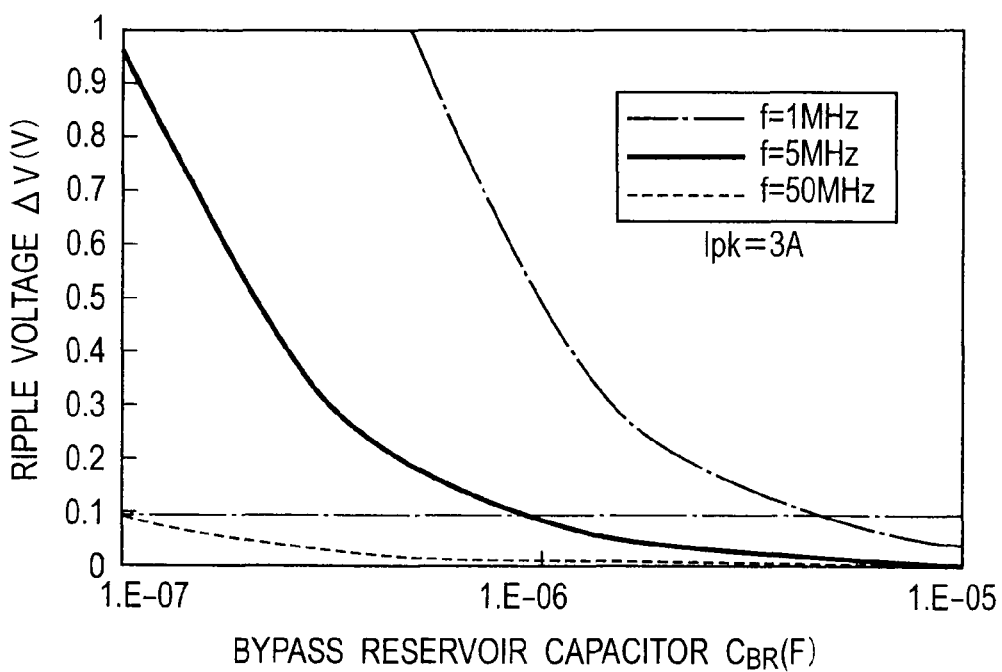
FIG. 8 shows a simulation result showing the relationship of the ripple voltage $\Delta V$ applying difference frequency f as a parameter, and the bypass reservoir capacitor $C_{BR}$, in the semiconductor device according to the embodiment.

On the other hand, FIG. 8 shows a simulation result showing the relationship between the ripple voltage ΔV applying the difference frequency Δf as a parameter, and the bypass reservoir capacitor (smoothing capacitor) $C_{BR}$.

As shown in FIG. 8, in order to reduce the ripple voltage ΔV to not more than 0.1 V, for example, where the current amplitude $I_{PK}$ is 3 A and the difference frequency Δf is 1 MHz the value of not less than 5 μF is needed for the bypass reservoir capacitor $C_{BR}$. Similarly, where the current amplitude $I_{PK}$ is 3 A and the difference frequency Δf is 5 MHz, the value of not less than 1 μF is needed for the bypass reservoir capacitor $C_{BR}$. Similarly, where the current amplitude $I_{PK}$ is 3 A and the difference frequency Δf is 50 MHz, the value of not less than 0.1 μF is needed for the bypass reservoir capacitor $C_{BR}$.

The semiconductor device 1 according to the embodiment connects between the end face of drain terminal electrode D of the high frequency semiconductor chip 24 and the bypass reservoir capacitor (smoothing capacitor) $C_{BR}$ at the shortest, and thereby the inductance between the end face of drain terminal electrode D of the high frequency semiconductor chip 24 and the bypass reservoir capacitor $C_{BR}$ can be reduced to the minimum.

For example, in the case of 6 GHz band 80 W class GaAs-MESFET (for example, TIM5964-80SL manufactured by Toshiba Corporation, Japan), when the difference frequency $\Delta f$ is 5 MHz, the value of the current amplitude $I_{PK}$ at the time of operation in −25 dBc is about 3 A, and the value of the bypass reservoir capacitor $C_{BR}$ needed in order to supply the amount of charge within the cycle of 5 MHz and for the ripple voltage $\Delta V$ to be within 0.1 V can be expressed by $C_{BR} = Q/\Delta V$ where $Q = I_{PK} \times \text{integral}(0 \text{ to } T/2) \sin \omega t \, dt = I_{PK} \times \text{integral}(0 \text{ to } \pi/\omega) \sin \omega t \, dt$, and therefore, the value of Q is $3 \times (1/2\pi f)$ = about $1 \times 10^{-7}$ (C), and $C_{BR}$ is 1 µF derived from the ripple voltage $\Delta V$ is 0.1 V.

In the case of measuring of third order intermodulation distortion IM3, when two frequencies are inputted into the one semiconductor device 1, the difference frequency component occurs. Here, when two input signals whose frequencies are nearly equal (frequencies f1 and f2; where f1−f2=several tens of MHz) is supplied to the semiconductor device 1, although signals having frequencies (2f2−f1) and (2f1−f2) are output from the semiconductor device 1 according to the nonlinear characteristics of the device, the third order intermodulation distortion IM3 has notated the signal level by the ratio to the signal level of the fundamental wave (f1 or f2).

In the basic measuring method of third order intermodulation distortion IM3, two fundamental wave signals are mixed and used for the semiconductor device 1 as an input signal. The third order intermodulation distortion IM3 occurred with the semiconductor device 1 is measured by a spectrum analyzer.

When the difference frequency $\Delta f$ is several MHz, the output voltage and the voltage of the end face of drain of the high frequency semiconductor chip 24 are smoothed by connecting a capacitor having electrostatic capacity of not less than 100 µF near the RF output terminal.

However, when a certain impedance exists between the bias power supply source and the end face of drain of the high frequency semiconductor chip 24, the voltage which appears in the end face of drain of the high frequency semiconductor chip 24 is modulated, thereby causing a negative effect on the amplification characteristics of the semiconductor device 1. For example, between the bias power supply source and the end face of drain of the high frequency semiconductor chip 24, a reactance (inductance L) exists corresponding to the distance. The modulated voltage amplitude (ripple voltage $\Delta V$) is expressed by $2\pi f \times L \times I$ where the alternating current of the frequency component f is I.

Accordingly, the effective bias power supply source is close to the high frequency semiconductor chip 24 by disposing the bypass reservoir capacitor $C_{BR}$ near the high frequency semiconductor chip 24, and therefore the reactance between the bias power supply source and the end face of drain of the high frequency semiconductor chip 24 can be kept small. In this case, the voltage of the end face of drain of the high frequency semiconductor chip 24 is the voltage of the end face of drain terminal electrode D of the high frequency semiconductor chip 24.

Since the ripple voltage $\Delta V$ is expressed by $\Delta V = 2\pi f \times L \times I$, $L = \Delta V/(2\pi f \times I)$ is satisfied. Therefore, when I=3 A and f=5 MHz, what is necessary is just to satisfy $L < 0.1/(2\pi \times 5 \times 10^{-6} \times 3)$, and to connect the bypass reservoir capacitor $C_{BR}$ within the distance from which the value of L is about 1 mH, in order to reduce the voltage amplitude (the ripple voltage $\Delta V$) to not more than 0.1 V.

Also, when I=3 A and f=100 MHz, what is necessary is just to satisfy $L < 0.1/(2\pi \times 100 \times 10^{-6} \times 3)$, and to connect the bypass reservoir capacitor $C_{BR}$ within the distance from which the value of L is about 50 µH, in order to reduce the voltage amplitude (the ripple voltage $\Delta V$) to not more than 0.1V.

Moreover, the reason for connecting the drain terminal electrode D of the high frequency semiconductor chip 24 and the feed through 39b utilized for capacitor via the bonding wire BW1 for connecting smoothing capacitor is that connecting by the wire bonding is the optimum choice since the effective electric length is short.

According to the embodiment, since it is connected without via the output matching circuit, it can be provide the semiconductor device which can smooth the voltage of the end face of drain of the high frequency semiconductor chip even when the difference frequency $\Delta f$ is several hundreds of MHz, and can be applied to the high frequency of the microwave/millimeter wave/submillimeter wave band.

(Configuration of High Frequency Semiconductor Chip)

An enlarged drawing of a schematic planar pattern configuration of the high frequency semiconductor chip 24 applied to the semiconductor device 1 according to the embodiment is expressed as shown in FIG. 9A, and an enlarged drawing of a part J of FIG. 9A is expressed as shown in FIG. 9B. Also, configuration examples 1-4 of the high frequency semiconductor chip 24 applied to the semiconductor device 1 according to the embodiment, and schematic cross section configuration examples 1-4 taken in the line IV-IV of FIG. 9B are expressed as shown in FIG. 10 to FIG. 13, respectively.

In the high frequency semiconductor chip 24 applied to the semiconductor device 1 according to the embodiment, as shown in FIG. 9 to FIG. 13, a plurality of FET cells FET 1 to FET 10 include: a semi-insulating substrate 110; a gate finger electrode 124, a source finger electrode 120, and a drain finger electrode 122 which are disposed on a first surface of the semi-insulating substrate 110, and have a plurality of fingers, respectively; a plurality of gate terminal electrodes G1, G2, . . . , G10, a plurality of source terminal electrodes S11, S12, S21, S22, . . . , S101, and S102 and the drain terminal electrodes D1, D2, . . . , D10 which are disposed on the first surface of the semi-insulating substrate 110, and ties a plurality of fingers, respectively every the gate finger electrode 124, the source finger electrode 120, and the drain finger electrode 122; VIA holes SC11, SC12, SC21, SC22, . . . , SC101, and SC102 disposed at the lower part of the source terminal electrodes S11, S12, S21, S22, . . . , S101, and S102; and a ground electrode (not shown) which is disposed on a second surface of the opposite side of a first surface of the semi-insulating substrate 110, and is connected via the VIA holes SC11, SC12, SC21, SC22, . . . , SC101, and SC102 to the source terminal electrodes S11, S12, S21, S22, . . . , S101, and S102.

The bonding wire 12 is connected to the gate terminal electrodes G1, G2, . . . , G10, and the bonding wire 14 is connected to the drain terminal electrodes D1, D2, . . . , D10.

The source terminal electrodes S11, S12, S21, S22, . . . , S101, and S102 are connected to the ground electrode (not shown), via the barrier metal layers (not shown) formed in the internal wall of the VIA holes SC11, SC12, SC21, SC22, . . . , SC101 and SC102, and via the filling metal layers formed on the barrier metal layers and filled up with the VIA holes The semi-insulating substrate 110 is either of a GaAs substrate, an SiC substrate, a GaN substrate, a substrate in which a GaN epitaxial layer is formed on the SiC substrate, a substrate which a heterojunction epitaxial layer composed of GaN/AlGaN is formed on the SiC substrate, a sapphire substrate or a diamond substrate.

Constructional Example 1

Figure 10:
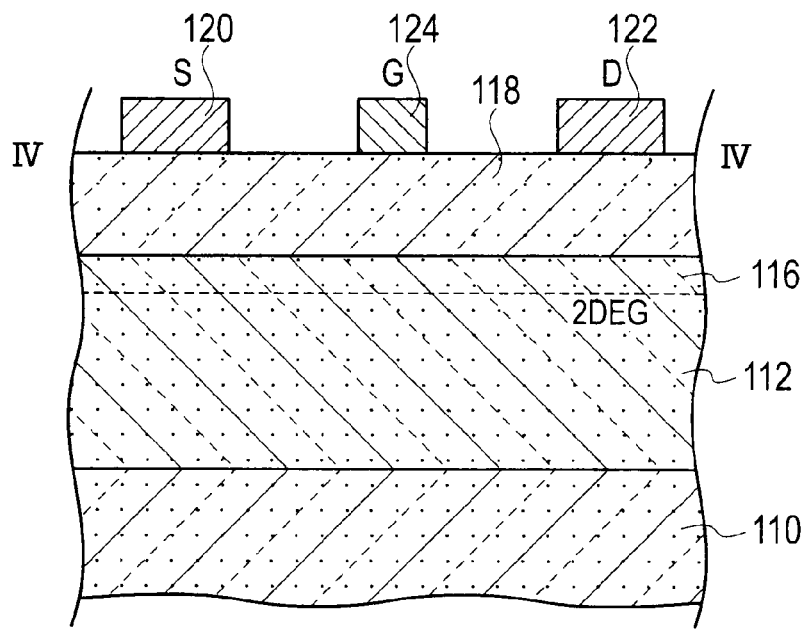
FIG. 10 is a constructional example 1 of the high frequency semiconductor chip applied to the semiconductor device according to the embodiment, and is a schematic cross-sectional configuration diagram taken in the line IV-IV of FIG. 9B.

As shown in FIG. 10, a configuration example 1 of an FET cell of the high frequency semiconductor chip 24 applied to the semiconductor device according to the embodiment, as a schematic cross-sectional configuration taken in the line IV-IV of FIG. 9B, includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; and a source finger electrode 120, a gate finger electrode 124, and a drain finger electrode 122 which are disposed on the aluminum gallium nitride layer ($Al_xGa_{1-x}N$) (where $0.1<=x<=1$) 118. A two dimensional electron gas (2 DEG) layer 116 is formed in the interface between the nitride based compound semiconductor layer 112 and the aluminum gallium nitride layer ($Al_xGa_{1-x}N$) (where $0.1<=x<=1$) 118. FIG. 10 shows a Hetero-junction Field Effect Transistor (HFET) or a High Electron Mobility Transistor (HEMT) as the constructional example 1.

Constructional Example 2

Figure 11:
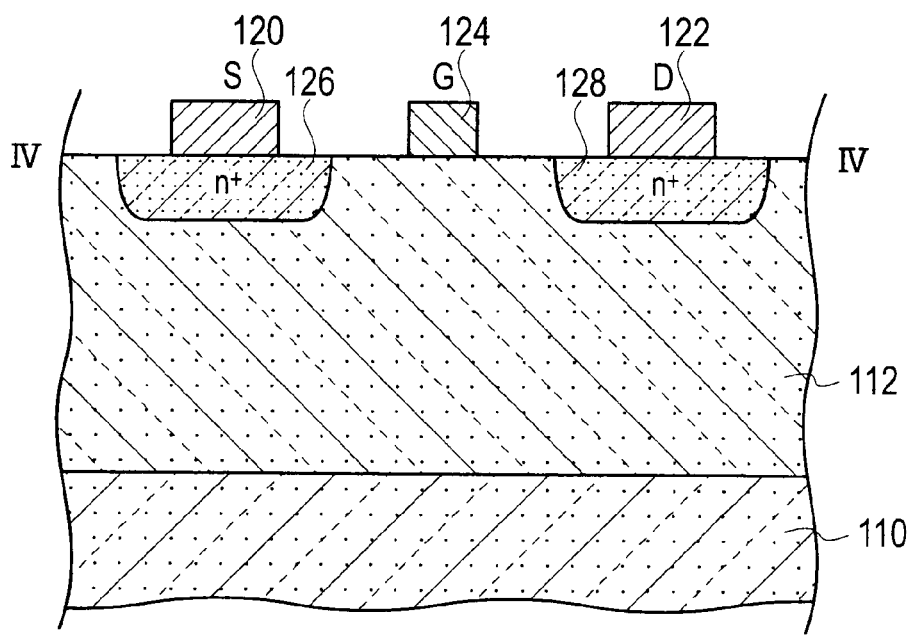
FIG. 11 is a constructional example 2 of the high frequency semiconductor chip applied to the semiconductor device according to the embodiment, and is a schematic cross-sectional configuration diagram taken in the line IV-IV of FIG. 9B.

As shown in FIG. 11, a constructional example 2 of an FET cell of the high frequency semiconductor chip 24 applied to the semiconductor device according to the embodiment, as a schematic cross-sectional configuration taken in the line IV-IV of FIG. 9B, includes: a semi-insulating substrate 110; a nitride based compound semiconductor layer 112 disposed on the semi-insulating substrate 110; a source region 126 and a drain region 128 which are disposed on the nitride based compound semiconductor layer 112; and a source finger electrode 120 disposed on the source region 126, a gate finger electrode 124 disposed on the nitride based compound semiconductor layer 112, and a drain finger electrode 122 disposed on the drain region 128. Schottky contact is formed in the interface between the nitride based compound semiconductor layer 112 and the gate finger electrode 124. FIG. 11 shows a Metal Semiconductor Field Effect Transistor (MESFET) as the constructional example 2.

Constructional Example 3

Figure 12:
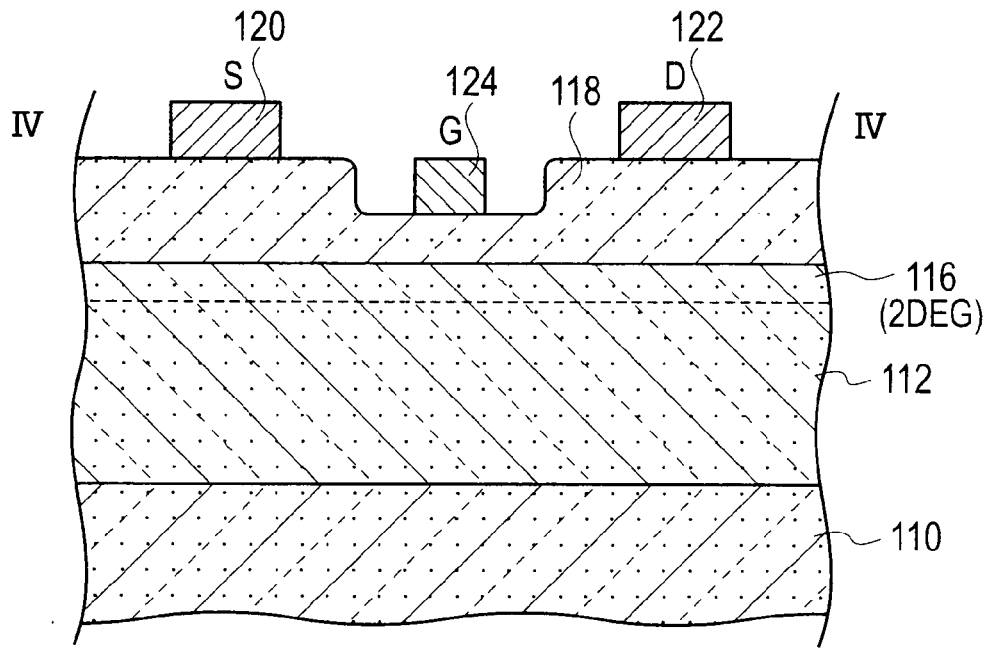
FIG. 12 is a constructional example 3 of the high frequency semiconductor chip applied to the semiconductor device according to the embodiment, and is a schematic cross-sectional configuration diagram taken in the line IV-IV of FIG. 9B.

As shown in FIG. 12, a constructional example 3 of an FET cell of the high frequency semiconductor chip 24 applied to the semiconductor device according to the embodiment, as a schematic cross-sectional configuration taken in the line IV-IV of FIG. 9B, includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode 120 and a drain finger electrode 122 which are disposed on the aluminum gallium nitride layer ($Al_xGa_{1-x}N$) (where $0.1<=x<=1$) 118; and a gate finger electrode 124 disposed at a recessed part on the aluminum gallium nitride layer ($Al_xGa_{1-x}N$) (where $0.1<=x<=1$) 118. The 2DEG layer 116 is formed in the interface between the nitride based compound semiconductor layer 112 and the aluminum gallium nitride layer ($Al_xGa_{1-x}N$) (where $0.1<=x<=1$) 118. FIG. 12 shows HFET or HEMT as the constructional example 3.

Constructional Example 4

Figure 13:
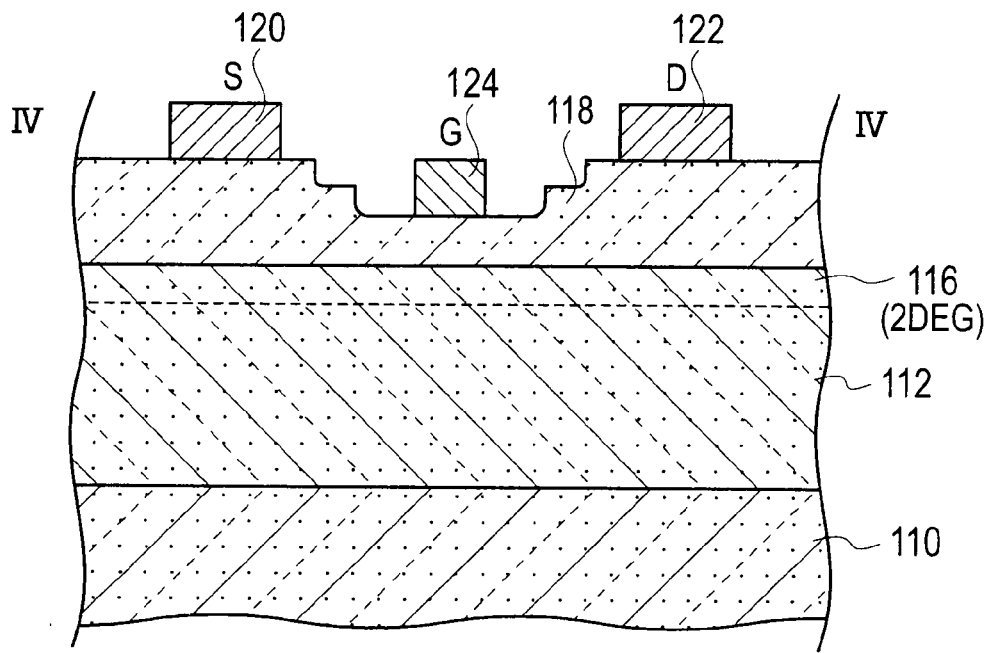
FIG. 13 is a constructional example 4 of the high frequency semiconductor chip applied to the semiconductor device according to the embodiment, and is a schematic cross-sectional configuration diagram taken in the line IV-IV of FIG. 9B.

As shown in FIG. 13, a constructional example 4 of an FET cell of the high frequency semiconductor chip 24 applied to the semiconductor device according to the embodiment, as a schematic cross-sectional configuration taken in the line IV-IV of FIG. 9B, includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode 120 and a drain finger electrode 122 which are disposed on the aluminum gallium nitride layer ($Al_xGa_{1-x}N$) (where $0.1<=x<=1$) 118; and a gate finger electrode 124 disposed at a two-step recessed part on the aluminum gallium nitride layer ($Al_xGa_{1-x}N$) (where $0.1<=x<=1$) 118. The 2 DEG layer 116 is formed in the interface between the nitride based compound semiconductor layer 112 and the aluminum gallium nitride layer ($Al_xGa_{1-x}N$) (where $0.1<=x<=1$) 118. FIG. 13 shows HFET or HEMT as the constructional example 4.

Moreover, in the above-mentioned constructional examples 1-4, the nitride based compound semiconductor layer 112 except an active area is electrically used as an inactivity isolation region. Here, the active area is composed of the source finger electrode 120, the 2DEG layer 116 directly under the gate finger electrode 124 and the drain finger electrode 122, and the 2 DEG layer 116 between the source finger electrode 120 and the gate finger electrode 124 and between the drain finger electrode 122 and the gate finger electrode 124.

As another fabrication method of the isolation region, it can also form by ion implantation to a part of depth direction of the aluminum gallium nitride layer ($Al_xGa_{1-x}N$) (where $0.1<=x<=1$) 18 and the nitride based compound semiconductor layer 112. As ion species, nitrogen (N), argon (Ar), etc. are applicable, for example. Moreover, the amount of dosage with the ion implantation is about $1 \times 10^{14}$ (ions/$cm^2$), for example, and accelerating energy is about 100 keV to 200 keV, for example.

On the isolation region and the device surface, an insulating layer for passivation (not shown) is formed. As the insulating layer, it can be formed of a nitride film, an alumina ($Al_2O_3$) film, an oxide film ($SiO_2$), an oxynitriding film (SiON), etc. deposited by a Plasma Enhanced Chemical Vapor Deposition (PECVD) method, for example.

The source finger electrode 120 and the drain finger electrode 122 are formed of Ti/Al etc., for example. The gate finger electrode 124 can be formed, for example of Ni/Au etc.

In addition, in the high frequency semiconductor chip 24 applied to the semiconductor device according to the embodiment, the pattern length of the longitudinal direction of the gate finger electrode 124, the source finger electrode 120, and the drain finger electrode 122 is set up to be short as the operating frequency becomes higher such as the microwave/millimeter wave/submillimeter wave. For example, in the millimeter wave band, the pattern length is about 25 μm to 50 μm.

Also, the width of the source finger electrode 120 is about 40 μm, for example, and the width of the source terminal electrode S11, S12, S21, S22, ..., S101, and S102 is about 100 μm, for example. Yet also, the formation width of the VIA holes SC11, SC12, SC21, SC22, ..., SC101, and SC102 is about 10 μm to about 40 μm, for example.

Modified Example

A schematic bird's-eye view configuration of a package for mounting a semiconductor device 1a according to a modified example of the embodiment, and a metal cap 10 is expressed as shown in FIG. 14A. A metal seal ring 14a is expressed as shown in FIG. 14B. A metal wall 16 is expressed as shown in FIG. 14C. A conductive base plate 200, and an input feed through 19a, an output feed through 19b and a feed through 39b utilized for capacitor disposed on an input side insulating layer 20a, an output side insulating layer 20b and an insulating layer 40b utilized for capacitor terminal, and each upper layer feed throughs 22 disposed on the input side insulating layer 20a, the output side insulating layer 20b, and the insulating layer 40b utilized for capacitor terminal are expressed as shown in FIG. 14D.

Figure 15:
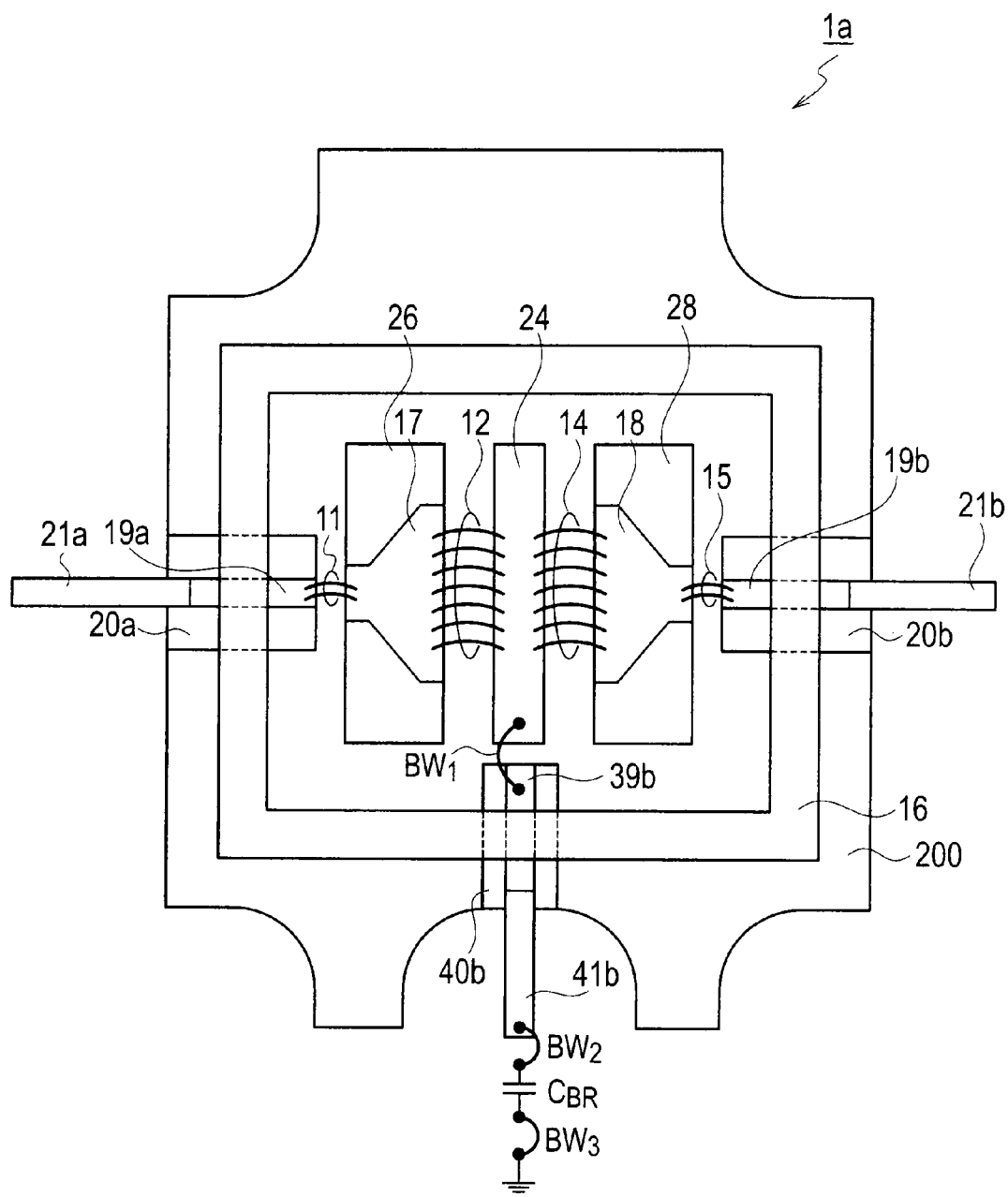
FIG. 15 is a schematic plane constitution diagram of the semiconductor device according to the modified example of the embodiment.

A schematic plane constitution of the semiconductor device 1 according to the modified example of the embodiment is expressed as shown in FIG. 15.

In the semiconductor device 1 according to the embodiment, as shown in FIG. 2, the high frequency output terminal 21b and the smoothing capacitor terminal 41b are disposed so as to adjoin each other. On the other hand, in the semiconductor device 1a according to the modified example of the embodiment, as shown in FIG. 15, the high frequency output terminal 21b and the smoothing capacitor terminal 41b are disposed at each side which is mutually adjoining in a quadrilateral. Since other configurations are the same as that of the semiconductor device 1 according to the embodiment, the duplicating explanation is omitted.

According to the modified example of the embodiment, the feed through 39b utilized for capacitor can be formed near by the semiconductor chip 24. For that reason, according to the modified example of the embodiment, the length of the bonding wire BW1 for connecting smoothing capacitor can be formed shorter than that of the first embodiment.

According to the embodiment and its modified example, since it is connected without via the output matching circuit, it can be provide the semiconductor device which can smooth the voltage of the end face of drain of the high frequency semiconductor chip even when the difference frequency Lf is several hundreds of MHz, and can be applied to the high frequency of the microwave/millimeter wave/submillimeter wave band.

The Other Embodiments

While certain embodiment and its modified example have been described, these embodiment and its modified example have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

In addition, as the high frequency semiconductor chip mounted in the semiconductor device according to the embodiments, it needless to say that not only the FET and HEMT but also amplifying elements, such as a Laterally Diffused Metal-Oxide-Semiconductor Field Effect Transistor (LDMOS) and a Hetero-junction Bipolar Transistor (HBT), and a Micro Electro Mechanical Systems (HEMS) element, etc. are applicable.

Thus, it includes various embodiments etc. which have not been described in this specification.

What is claimed is:
1. A semiconductor device comprising:
a high frequency semiconductor chip;
an input matching circuit disposed at an input side of the high frequency semiconductor chip;
an output matching circuit disposed at an output side of the high frequency semiconductor chip;
a high frequency input terminal connected to the input matching circuit;
a high frequency output terminal connected to the output matching circuit; and
a smoothing capacitor terminal connected to the high frequency semiconductor chip, wherein
the high frequency semiconductor chip, the input matching circuit and the output matching circuit are housed by one package, and
the high frequency semiconductor chip comprises
a semi-insulating substrate;
a gate finger electrode, a source finger electrode, and a drain finger electrode configured to be disposed on a first surface of the semi-insulating substrate, and configured to have a plurality of fingers, respectively;
a plurality of gate terminal electrodes, a plurality of source terminal electrodes, and a drain terminal electrode configured to be disposed on the first surface of the semi-insulating substrate, and configured to tie a plurality of fingers, respectively for each of the gate finger electrode, the source finger electrode, and the drain finger electrode;
VIA holes, each configured to be disposed at a lower part of each source terminal electrode; and
a ground electrode configured to be disposed on a second surface of the opposite side of the first surface of the semi-insulating substrate, and configured to be connected via the VIA holes to the source terminal electrodes.

2. The semiconductor device according to claim 1 further comprising:
a smoothing capacitor connected between the smoothing capacitor terminal and ground potential, wherein
the smoothing capacitor has a value more than $C_{BR}=I_{PK} \times (1/2\pi\Delta f)/\Delta V$
where $C_{BR}$ is a value of the smoothing capacitor, $I_{PK}$ is a value of current amplitude, $\Delta V$ is a value of an allowable ripple voltage, and $\Delta f$ is a value of difference frequency.

3. The semiconductor device according to claim 1 further comprising:
a feed through utilized for capacitor connected to the high frequency semiconductor chip, wherein
the smoothing capacitor terminal is connected to the drain terminal electrode of the high frequency semiconductor chip via the feed through utilized for capacitor.

4. The semiconductor device according to claim 3 further comprising:
a bonding wire for connecting the drain terminal electrode of the high frequency semiconductor chip, and the feed through utilized for capacitor.

5. The semiconductor device according to claim 1 further comprising:
an input feed through connected to the input matching circuit, wherein
the high frequency input terminal is connected to each gate terminal electrode of the high frequency semiconductor chip via the input feed through.

6. The semiconductor device according to claim 1 further comprising:
an output feed through connected to the output matching circuit, wherein
the high frequency output terminal is connected to the drain terminal electrode of the high frequency semiconductor chip via the output feed through.

7. The semiconductor device according to claim 1, wherein the high frequency output terminal and the smoothing capacitor terminal are disposed to adjoin each other.

8. The semiconductor device according to claim 1, wherein the high frequency output terminal and the smoothing capacitor terminal are disposed at each side being mutually adjoining in a quadrilateral.

9. The semiconductor device according to claim 1, wherein the semi-insulating substrate is one of a GaAs substrate, an SiC substrate, a GaN substrate, a substrate formed of a GaN epitaxial layer on the SiC substrate, a substrate formed of a heterojunction epitaxial layer composed of GaN/AlGaN on the SiC substrate, a sapphire substrate, or a diamond substrate.

* * * * *